(12) United States Patent
Sydorko et al.

(10) Patent No.: US 8,714,609 B2
(45) Date of Patent: May 6, 2014

(54) METHOD AND SYSTEM FOR REPOSITIONING OF A FLEXIBLE SUBSTRATE

(75) Inventors: Christopher M. Sydorko, Red Lion, PA (US); Craig Hafner, Lutherville, PA (US)

(73) Assignee: J. L. Souser & Associates, Inc., York, PA (US)

( * ) Notice: Subject to any disclaimer, the term of this patent is extended or adjusted under 35 U.S.C. 154(b) by 0 days.

(21) Appl. No.: 13/639,601

(22) PCT Filed: Jun. 13, 2011

(86) PCT No.: PCT/US2011/040133
§ 371 (c)(1),
(2), (4) Date: Oct. 5, 2012

(87) PCT Pub. No.: WO2011/162995
PCT Pub. Date: Dec. 29, 2011

(65) Prior Publication Data
US 2013/0026775 A1    Jan. 31, 2013

Related U.S. Application Data

(60) Provisional application No. 61/357,208, filed on Jun. 22, 2010.

(51) Int. Cl.
*B25J 15/06* (2006.01)

(52) U.S. Cl.
USPC .................................................... 294/64.3

(58) Field of Classification Search
USPC .............. 294/64.3, 185; 901/40; 414/752.1
See application file for complete search history.

(56) References Cited

U.S. PATENT DOCUMENTS

| | | | |
|---|---|---|---|
| 5,169,196 A * | 12/1992 | Safabakhsh | 294/64.3 |
| 6,427,991 B1 * | 8/2002 | Kao | 269/21 |
| 7,398,735 B1 * | 7/2008 | Sunderland | 104/10 |
| 7,597,370 B2 * | 10/2009 | Tanae et al. | 294/64.3 |
| 8,172,288 B2 * | 5/2012 | Jonas et al. | 294/64.3 |
| 2002/0067585 A1 | 6/2002 | Fujiwara | |
| 2005/0151282 A1 | 7/2005 | Harper et al. | |
| 2010/0052345 A1 | 3/2010 | Chang et al. | |

* cited by examiner

*Primary Examiner* — Dean Kramer
(74) *Attorney, Agent, or Firm* — McNees Wallace & Nurick LLC

(57) ABSTRACT

A material handling system includes a body including a first member and a second member. The first member and the second member define a hollow cavity within the body, and a gap disposed between the first member and the second member. The body is in flow communication with a first gas source to provide pressurized gas flow through the gap to generate a lifting force on an object placed adjacent to the body. The body has channels disposed within a central region of the body in flow communication with a second gas source. The channels are arranged to controllably disengage the object from the body.

17 Claims, 4 Drawing Sheets

METHOD AND SYSTEM FOR REPOSITIONING OF A FLEXIBLE SUBSTRATE

CROSS REFERENCE TO RELATED APPLICATIONS

This application claims the benefit of U.S. Provisional Application No. 61/357,208 filed Jun. 22, 2010. The disclosure of the Provisional Application is hereby incorporated by reference.

BACKGROUND

The present disclosure relates generally to material handling systems and methods. More specifically, the present disclosure relates to materials handling systems and methods involving a Bernoulli air flow.

Known systems and methods utilize the Bernoulli principle for providing a differential pressure to lift an object in a materials handling system. The differential pressure can be generated by transporting air through one or more passages to decrease pressure in a chamber. The decreased pressure in the chamber can lift the object.

In some systems and methods, the object is lifted and suspended in air while an arm or other positioning device moves the object. The object can be selectively lowered by decreasing the air flow in the passages, thereby decreasing the differential pressure. In some systems and methods, the object does not contact any portion of the system. In other systems and methods, the object does contact a portion of the system.

For example, the semiconductor industry utilizes many different wafer handling systems or wafer transport mechanisms. These wafers are thin, rigid objects that can be transferred through the use of tooling designed with the Bernoulli principles. Pressurized air or gas is forced through a small gap between two plates at an angle to each other and at an angle to the wafer. As the air escapes, it creates a low area of pressure just above the wafer which allows for lift. When the air is removed, the pressure equalizes which allows the wafers to drop or release from the tool. These devices include frictionless contact since the product does not contact the surface of the tool, but rather the rushing air acts as a frictionless bearing surface. Stability can be maintained in these by using small contact surfaces around the face of the tooling.

In the systems and methods in which the object contacts the system when it is lifted by the differential pressure, the object can adhere to the system. For example, the object can be forced into the chamber and remain in place due to friction from sides of the chamber contacting the object. This drawback is intensified with flexible objects. A flexible object can deform, wrap around, and/or compress within the chamber or other protrusions of the system when the differential pressure lifts the object to abut the system. When the flexible object adheres to the system, releasing of the flexible object may be delayed, slowed, and/or otherwise made inconsistent (i.e., the equalization of pressure can be interrupted).

What is needed is a system and method for lifting an object by applying a differential pressure, wherein the object can be controllably removed.

SUMMARY

In one aspect, a material handling system includes a body including a first member and a second member. The first member and the second member define a hollow cavity within the body, and a gap disposed between the first member and the second member. The body is in flow communication with a first gas source to provide pressurized gas flow through the gap to generate a lifting force on an object placed adjacent to the body. The force is created by the Bernoulli effect of the differential pressure. The body has channels disposed within a central region of the body in flow communication with a second gas source. The channels are arranged to controllably disengage the object from the body.

In another aspect of the disclosure a Bernoulli disc includes a body attachable to a robotic arm. The body includes a first member and a second member. The first member and the second member define a hollow cavity within the body. A gap is disposed between the first member and the second member. The body is in flow communication with a first gas source to provide pressurized gas flow through the gap to generate a lifting force on an object placed adjacent to the body. Channels are disposed in a central region of the body. The channels are in flow communication with a second gas source. The channels are arranged to controllably disengage the object.

In yet another aspect, a method for repositioning objects includes: providing a body attachable to a robotic arm, connecting the body to a first gas source introducing gas from the first gas source through a Bernoulli flow passage in the body, creating a differential pressure to lift an object into contact with the body; connecting a second gas source to a plurality of channels; introducing gas from the second gas source into the plurality of channels; directing a flow through the channels to a central region of the body; applying a substantially downward force to the object; and disengaging the object from contact with the body.

Another aspect of the present disclosure includes a system having a disc, e.g., a Bernoulli disc, including a port or flow path for applying a gas flow in a generally downward direction to force objects downward to reduce or eliminate instances of objects adhering to the disc.

Another aspect of the present disclosure includes a materials handling process using a Bernoulli disc. In this aspect, a flexible material is lifted by a differential pressure, the flexible material contacts the Bernoulli disc, and a selectively applied gas flow forces the flexible material away from the Bernoulli disc.

One advantage of the present disclosure is that flexible objects, which may otherwise adhere to a Bernoulli disc, can be predictably released from the materials handling device at a precise position.

Another advantage of the present disclosure is that movement of an object can be achieved more quickly utilizing the Bernoulli disc.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

The present disclosure describes a system and method for lifting an object by applying a differential pressure, wherein the object can be controllably removed.

Embodiments of the present disclosure permit the differential pressure to lift a flexible object, e.g., a food item such as a pancake or a tortilla, a Frisbee®, coaster, lid, placemat, or other similarly flexible product, that may adhere temporarily or permanently within a Bernoulli disc, and to more easily permit movement of an object by automated handling equipment more easily by utilizing the Bernoulli disc. As used herein, Bernoulli disc refers to a disc body having a concave or tapered profile with a cooperating nozzle or plate to define a gas flow, usually compressed air. The gas flow between the disc body and the object provides a differential pressure which applies a lifting force between the Bernoulli disc and the object, as described in greater detail below.

Figure 1:
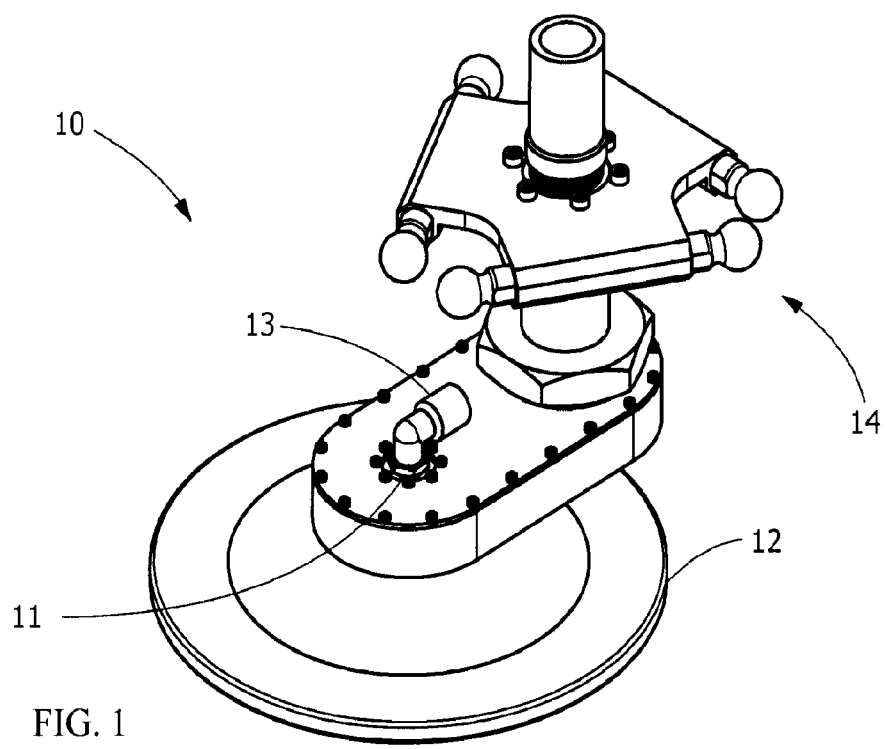
FIG. 1 shows a perspective view of an exemplary system according to the disclosure.
Figure 3:
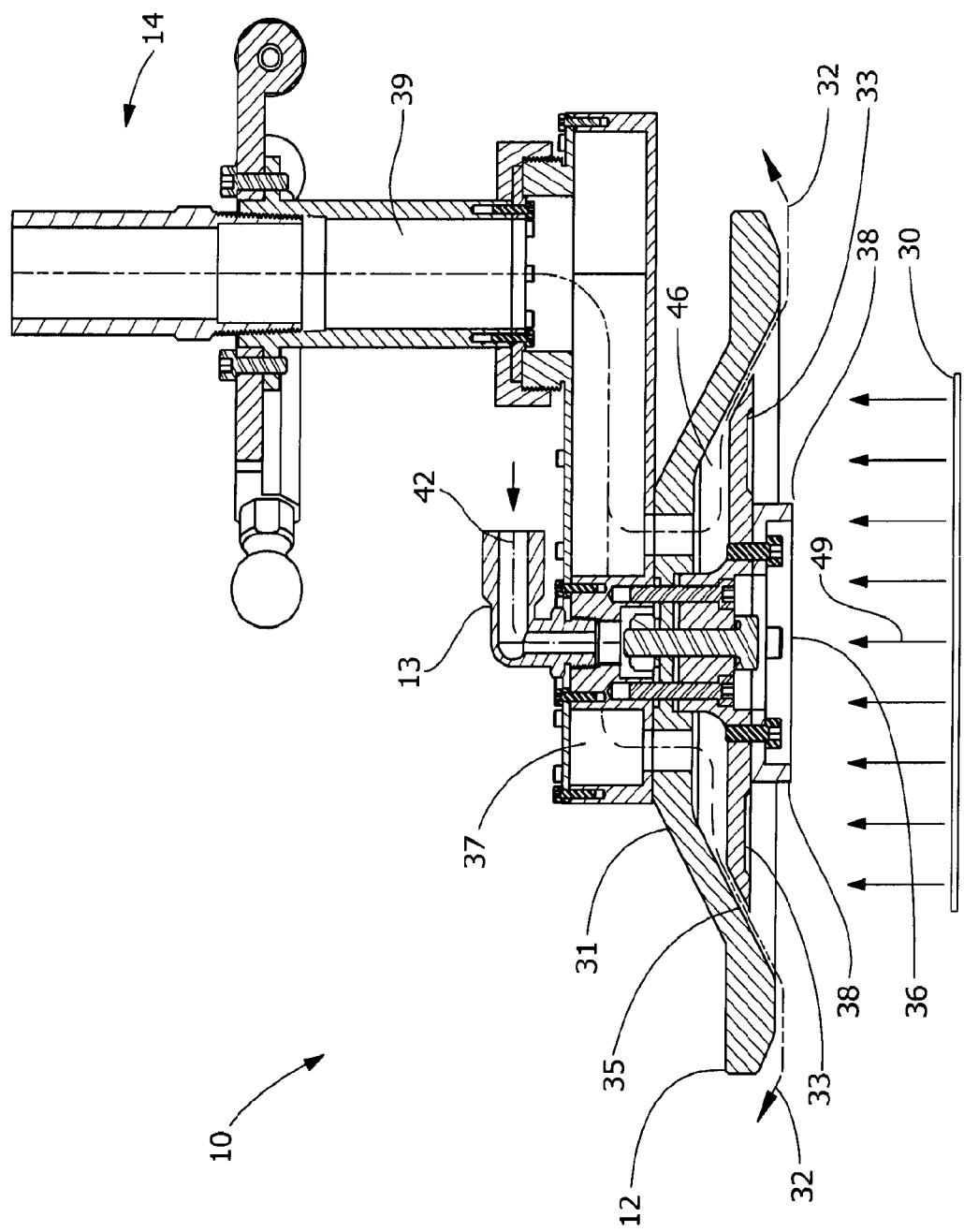
FIG. 3 shows a cross-sectional view of the exemplary embodiment from FIG. 2 along line 3-3.

FIGS. 1 & 3 show a system 10 or assembly for controllably repositioning a flexible substrate or object 30. As will be appreciated by persons skilled in the art, system 10 can also be used for repositioning rigid substrates. System 10 includes a body 12 arranged and disposed for directing a Bernoulli flow 32 in a direction that creates a differential pressure between body 12 and object 30. Bernoulli flow 32 can be formed by any suitable gas, for example, air, nitrogen, argon, or other suitable gasses. The differential pressure formed by the Bernoulli flow 32 permits an object 30, for example, a flexible object 30 to be lifted. Body 12 can have a generally round or circular disc-like shape. Body 12 can depend from a positioning apparatus 14 permitting the selective movement of object 30. Positioning apparatus 14 can be manually or robotically controlled. For example, positioning apparatus 14 can be part of an apparatus configured for manipulation by a robotic system (not shown). The robotic system may be any suitable system permitting selective movement of body 12.

Figure 2:
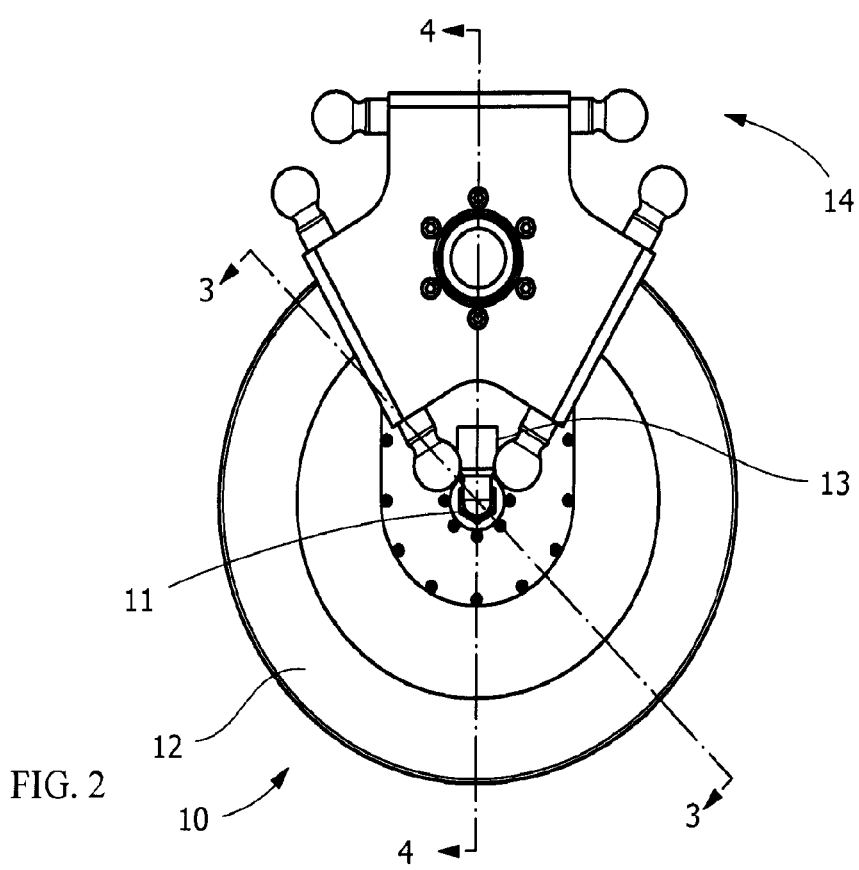
FIG. 2 shows a top view of an exemplary system according to the disclosure.

FIG. 2 shows a top view of system 10. Body 12 may be hingedly secured to positioning apparatus 14, thereby permitting system 10 to maintain object 30 at a substantially level orientation. A spacer 11 can be positioned on body 12. Spacer 11 secures a connector fitting 13 for providing air flow to apply a downdraft or flow for disengaging objects 30 in a manner as described below. In one embodiment, connector fitting 13 is an electroplated hard, wear resistant coating. In one embodiment, body 12 may include an upper body or member 31 (FIG. 3) which is mated to a lower body or member 33 (FIG. 3). Upper member 31 and lower member 33 define a cavity 46. Body 12 is removably secured to positioning apparatus 14 through any suitable fastening mechanism. Body 12 includes a gap 35 (FIG. 3) defined by upper member 31 and lower member 33, to allow gas to flow through cavity 46, between upper member 31 and lower member 33. In a preferred embodiment, member 31 may be machined from plastic and member 33 may be machined from metal.

FIG. 3 shows a cross-sectional view of system 10 in FIG. 2 along line 3-3. Object 30 is lifted by a pressurized air flow or a Bernoulli flow 32 flowing from positioning apparatus 14 through one or more gaps 35. When Bernoulli flow 32 flows away from body 12, a differential pressure is induced between body 12 and object 30. A force indicated by arrows 49 is created by the differential pressure, which lifts object 30 towards a central region 36 of body 12. When object 30 reaches body 12, contact between object 30 and body 12 may occur. In one embodiment, contact with body 12 occurs on the periphery of central region 36 defined by protrusion 38. When object 30 is a flexible substrate/product, the contact between object 30 and body 12 may result in object 30 adhering, momentarily or permanently, against protrusion 38, or another part of body 12. In one exemplary embodiment, protrusion 38 may be a continuous wall or ring centered, or approximately centered, on lower member 33. In alternate embodiments, protrusion 38 may be projections or features depending from lower member 33 in central region 36.

The duration of momentary adherence to body 12 by object 30 can be decreased (as further described below with reference to FIG. 4), thereby permitting a higher process speed for handling of materials in a manufacturing setting. Permitting this momentary contact may, however, permit lifting of object 30 at a greater speed.

Differential pressure is generated or maintained by a pressurized gas manifold 37, additional channels or flow paths or conduit 39 for Bernoulli flow 32, and/or other suitable features for maintaining or adjusting pressure within body 12 and/or positioning apparatus 14.

Figure 4:
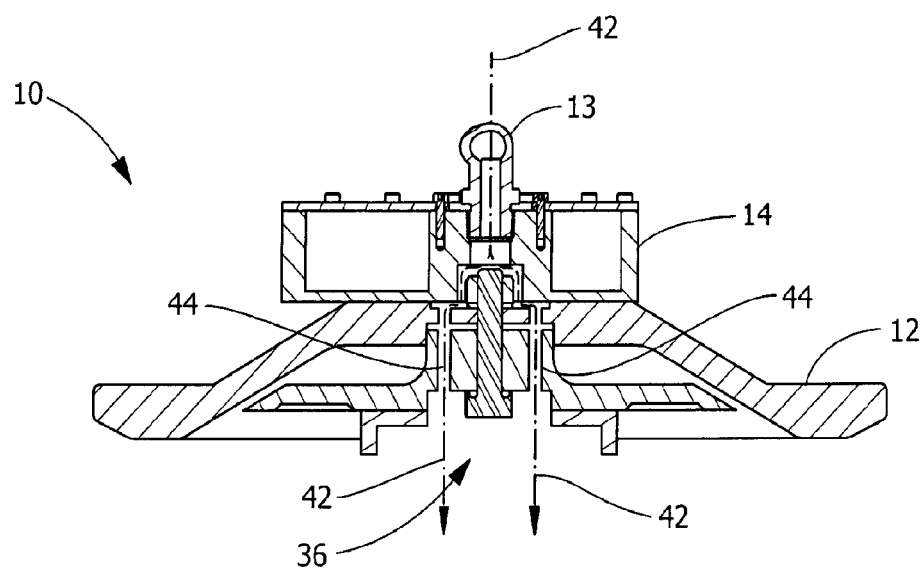
FIG. 4 shows a cross-sectional view of the exemplary embodiment from FIG. 2 along line 4-4.

FIG. 4 shows a cross-sectional view of system 10 in FIG. 2 along line 4-4. A flow 42, e.g., a pressurized gas or air blow-off flow, is directed to central region 36 of body 12. Flow 42 can be at a pressure above atmospheric pressure, or any other suitable pressure, in a closed environment (for example, a pressure above Bernoulli flow 32). Flow 42 passes through connector fitting 13 from an air hose or other gas source (not shown). Flow 42 travels through one or more channels 44. Flow 42 remains separate from Bernoulli flow 32 that lifts object 30. Flow 42 can controllably release object 30 when object 30 is detained within the body by applying a downward force against object 30 in at least center region 36. Flow 42 may also permit additional control of the process of lifting object 30. Flow 42 may be applied in a downward (i.e., the direction of gravity) or substantially downward direction. To disengage object 30, flow 42 applies at least sufficient downward force, which in combination with gravity, is greater than the adhering force of object 30 with body 12.

Figure 5:
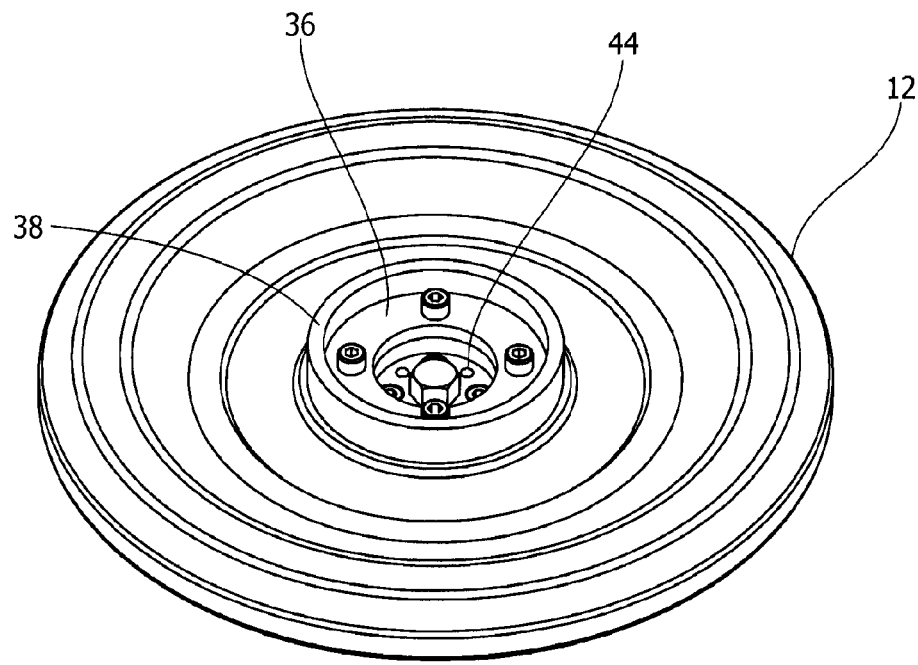
FIG. 5 shows a bottom perspective view of an exemplary body of a system according to an exemplary embodiment.

FIG. 5 shows a bottom perspective view of body 12. As shown in FIG. 5, protrusions 38 define a ring within central region 36, which may be substantially circular. Channels 44 (FIG. 4) may be a plurality of holes positioned within central region 36 inside the ring defined by protrusions 38.

Figure 6:
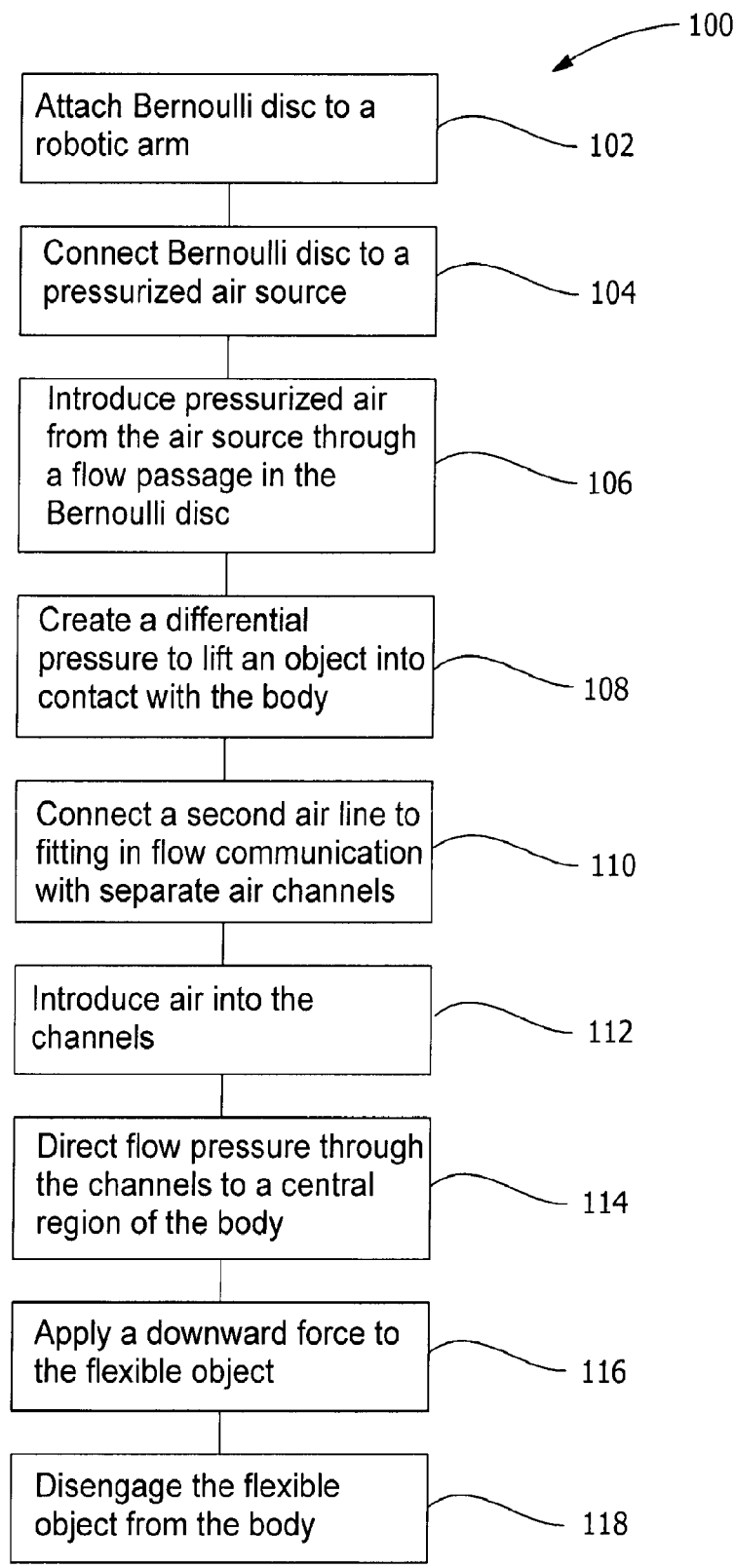
FIG. 6 shows a flow diagram of an exemplary method of repositioning a flexible object.

Referring next to FIG. 6, a method 100 is described. Method 100 includes the steps of providing a body attachable to a robotic arm at step 102; connecting the body to a first gas source at step 104; introducing gas from the first gas source through a Bernoulli flow passage in the body step 106; creating a differential pressure to lift an object into contact with the body step 108; connecting a second gas source to a plurality of channels step 110; introducing gas from the second gas source into the plurality of channels step 112; directing a flow through the channels to a central region of the body step 114; applying a substantially downward force to the object at step 116; and disengaging the object from contact with the body at step 118.

The invention discloses a body attachable to a robotic arm, a Bernoulli flow passage connected to a gas source for creating a differential pressure, and a flow directed to a central region of the body, the flow being configured to provide a substantially downward force to counteract any forces preventing downward motion of an object lifted by the pressure differential.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A material handling system, comprising:
a body comprising a first member and a second member, the first member and second member defining a hollow cavity within the body, and a gap disposed between the first member and the second member; the body in flow communication with a first gas source to provide a first pressurized gas flow through the gap to generate a lifting force on an object placed adjacent the body;
at least one channel disposed in a central region of the body, the at least one channel in flow communication with a second gas source, the channel arranged to controllably disengage the object with a second pressurized gas flow from the second gas source;
wherein the second pressurized gas flow from the second gas source applies a downward force against the object in at least the central region, the downward force, in combination with gravity, being greater than an adhering force of the object with the body;
wherein the lifting force lifts the object towards the central region of the body wherein contact between the object and the body occurs on a periphery of the central region, the central region defined by at least one protrusion defining the periphery of the central region; and
wherein the at least one protrusion extends outwardly from the central region of the body to form a most distal portion of the body.

2. The system of claim 1, wherein the first pressurized gas flow from the first gas source passes between the first gas source, the cavity and the gap for creating a differential pressure that generates the lifting force.

3. The system of claim 1, wherein the first gas source and the second gas source operate mutually exclusively.

4. The system of claim 1, wherein the body is arranged for directing a Bernoulli flow in a radially outward direction to create a differential pressure that generates the lifting force between the body and the object.

5. The system of claim 1, wherein the body is characterized by a generally circular disc-like shape.

6. The system of claim 1, wherein the body depends from a positioning apparatus, the positioning apparatus providing selective movement of the object.

7. The system of claim 6, wherein the positioning apparatus further comprises a conduit for the first pressurized gas flow.

8. The system of claim 7, the positioning apparatus further comprising a connector fitting for attaching an air hose to the second gas source.

9. The system of claim 6, wherein the body is secured by a hinge to the positioning apparatus, the hinge arranged to maintain the body or the object at a substantially level orientation.

10. The system of claim 6, wherein the positioning apparatus further includes a manifold in flow communication with the first gas source and the body, and the differential pressure is generated or maintained by pressurizing gas from the first gas source in the manifold.

11. The system of claim 1, wherein the at least one protrusion comprises a continuous wall approximately centered on a lower member.

12. The system of claim 1, wherein the at least one protrusion comprises a substantially circular ring within the central region.

13. The system of claim 1, wherein the second pressurized gas source comprises a pressure greater than a pressure of a Bernoulli flow.

14. The system of claim 1, wherein the at least one channel comprises a plurality of holes positioned within the central region defined by the protrusion.

15. A method, comprising:
providing a body attachable to a robotic arm;
connecting the body to a first gas source;
introducing gas from the first gas source through a Bernoulli flow passage in the body;
creating a differential pressure to lift an object into contact with a periphery of a central region of the body;
connecting a second gas source to a plurality of channels;
introducing gas from the second gas source into the plurality of channels;
directing a flow through the channels to the central region of the body;
applying a substantially downward force to the object; and
disengaging the object from contact with the periphery of the central region of the body;
wherein the periphery of the central region is defined by at least one protrusion extending outwardly from the central region of the body to form a most distal portion of the body.

16. An article, comprising:
a body attachable to a robotic arm, the body comprising a first member and a second member, the first member and second member defining a hollow cavity within the body, and a gap disposed between the first member and the second member; the body in flow communication with a first gas source to provide a first pressurized gas flow through the gap to generate a lifting force on an object placed adjacent the body;
a central region of the body;
at least one protrusion defining a periphery of the central region, the at least one protrusion extending outwardly from the central region of the body to form a most distal portion of the body on which contact occurs between the object and the body; and
at least one channel disposed in the central region of the body, the at least one channel in flow communication with a second gas source, the channel arranged to controllably disengage the object with a second pressurized gas flow from the second gas source;
wherein the second pressurized gas flow from the second gas source applies a downward force against the object in at least the central region, the downward force, in combination with gravity, being greater than an adhering force of the object with the body.

17. The article of claim 16, wherein the pressurized gas flow through the gap generates a Bernoulli effect in the gap to lift the object.

* * * * *